United States Patent
Wiecha et al.

(10) Patent No.: US 9,837,947 B2
(45) Date of Patent: Dec. 5, 2017

(54) CONTROL DEVICE FOR AN ELECTRIC MOTOR, VEHICLE AND METHOD

(71) Applicant: Robert Bosch GmbH, Stuttgart (DE)

(72) Inventors: Thomas Wiecha, Asperg (DE);
Michele Hirsch, Esslingen (DE);
Marcel Maur, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/306,874

(22) PCT Filed: Mar. 5, 2015

(86) PCT No.: PCT/EP2015/054620
§ 371 (c)(1),
(2) Date: Oct. 26, 2016

(87) PCT Pub. No.: WO2015/165622
PCT Pub. Date: Nov. 5, 2015

(65) Prior Publication Data
US 2017/0047879 A1    Feb. 16, 2017

(30) Foreign Application Priority Data
Apr. 30, 2014 (DE) ........................ 10 2014 208 139

(51) Int. Cl.
*H02P 1/00* (2006.01)
*H02P 27/06* (2006.01)
(Continued)

(52) U.S. Cl.
CPC .......... *H02P 27/06* (2013.01); *B60L 11/1803* (2013.01); *G01R 31/34* (2013.01);
(Continued)

(58) Field of Classification Search
CPC ...... H02P 27/08; H02P 27/06; H02M 7/5387; G01R 31/34; B60L 11/1803
(Continued)

(56) References Cited

U.S. PATENT DOCUMENTS 4,777,579 A    10/1988 Jahns et al.
5,686,839 A *  11/1997 Takagi .................. B60L 3/0023
                                                        324/503
(Continued)

FOREIGN PATENT DOCUMENTS

DE    102011013857    3/2012
EP    2444817         4/2012
JP    2000134955      5/2000

OTHER PUBLICATIONS

Machine Translation of JP 2000134955, Kobayashi et al., May 12, 2000, Hitachi Ltd.*
(Continued)

*Primary Examiner* — Bentsu Ro
*Assistant Examiner* — Gabriel Agared
(74) *Attorney, Agent, or Firm* — Michael Best & Friedrich LLP

(57) ABSTRACT

Embodiments relate to a control device for an electric motor having at least one phase. The control device includes a power unit having a first switching element and a first flyback element corresponding to the first switching element and a second switching element and a second flyback element corresponding to the second switching element. The first switching element is designed to couple a corresponding power connection of the motor with a positive supply voltage. The second switching element is designed to couple the corresponding power connection of the motor with a negative supply voltage; and a control unit designed to separately detect a first current flowing through the first switching element or second switching element correspond-
(Continued)

ing to the phase, to detect a second current flowing through the flyback element corresponding to the respective second switching element or first switching element, and to control the switching elements of the power unit.

10 Claims, 6 Drawing Sheets

(51) Int. Cl.
*H02P 27/08* (2006.01)
*H02M 7/5387* (2007.01)
*B60L 11/18* (2006.01)
*G01R 31/34* (2006.01)
*H01L 27/06* (2006.01)

(52) U.S. Cl.
CPC .......... *H02M 7/5387* (2013.01); *H02P 27/08* (2013.01); *H01L 27/0629* (2013.01)

(58) Field of Classification Search
USPC .......................................................... 318/139
See application file for complete search history.

(56) References Cited

U.S. PATENT DOCUMENTS

| 6,204,617 B1* | 3/2001 | Van Hout | H02P 6/185 |
| | | | 318/400.32 |
| 8,164,298 B2* | 4/2012 | Anwar | G01R 31/025 |
| | | | 318/430 |
| 2009/0147426 A1* | 6/2009 | Klausgrete | H02H 9/02 |
| | | | 361/93.9 |
| 2011/0231040 A1 | 9/2011 | Schulz et al. | |

OTHER PUBLICATIONS

International Search Report for Application No. PCT/EP2015/054620 dated Jul. 28, 2015 (English Translation, 2 pages).

* cited by examiner

CONTROL DEVICE FOR AN ELECTRIC MOTOR, VEHICLE AND METHOD

BACKGROUND OF THE INVENTION

The invention relates to a control device for an electric motor having at least one phase. The present invention furthermore relates to a corresponding vehicle and a corresponding method.

Electric motors, also known as electric machines, are used today in a multiplicity of applications.

Such motors can, for example, be used in industrial plants in order, e.g., to drive various mechanical devices. Electric motors can, e.g., however also be used in vehicles in order to drive said vehicles. Such vehicles can, e.g., be electric bicycles, electric cars, hybrid vehicles or the like. Hybrid vehicles have, e.g., a conventional internal combustion engine, which is combined with an electric motor in order to reduce the fuel consumption of the vehicle or to increase the cruising range of the vehicle.

In order to actuate such electric motors, control systems are typically used which converts a DC voltage, which is provided in the vehicles, e.g., by a battery or a fuel cell, into phase voltages suitable for the actuation of the respective motor.

The German patent specification DE 10 2011 0138957 A1 discloses a conventional method for controlling an electric motor.

It is common practice today to detect the currents which flow through the individual switching elements of the control system in order to operate and to monitor the function of the control system or respectively the drive system consisting of battery, control system and electric motor. To this end, the detected current strengths are compared, e.g., with predefined maximum values and a fault is indicated if one of the detected currents lies above the corresponding maximum value.

The measured currents can also be used to control the electric motor. To this end, the individual phase currents for the phases of the electric motor or respectively the DC component of the motor current are detected during normal operation without faults.

Such an arrangement is depicted in FIG. 6. FIG. 6 shows a three-phase electric motor M, which is coupled with an inverter I. The inverter I has two switching elements for each of the three phases, which switching elements can couple the respective phase with a positive voltage + or respectively with a negative voltage −. A current sensor SE-1, SE-2, SE-3 is disposed in each of the phases, said current sensor detecting the current in the respective phase.

Sensors which lie outside of the half-bridge switch are typically used to measure the current. Hall effect sensors or sensors which use the GMR or AMR effect or something similar can, e.g., be used as sensors.

In so doing, the external sensors are relatively large, which leads to an enlargement of the required installation space and to a more complex construction. The costs are furthermore increased by the additional components.

SUMMARY OF THE INVENTION

The invention accordingly relates to:

a control device for an electric motor having at least one phase, said control device comprising: a power unit which, for each phase of the electric motor, has a first switching element and a first flyback element corresponding to the first switching element, as well as a second switching element and a second flyback element corresponding to the second switching element, wherein the respective first switching element is designed to couple a corresponding power connection of the electric motor with a positive supply voltage, and the respective second switching element is designed to couple the corresponding power connection of the electric motor with a negative supply voltage; and a control unit which is designed to separately detect, in each of the phases, a first current flowing through the first switching element or second switching element corresponding to the phase, and which is designed to detect a second current flowing through the flyback element corresponding to the respective second switching element or first switching element, and which control unit is also designed to control the switching elements of the power unit, based on the detected currents.

The invention also relates to:

a vehicle comprising an electric motor having at least one phase, said vehicle also comprising an energy source as well as a control device according to the invention, which, for each phase of the motor, has a first switching element and a first flyback element corresponding to the first switching element, as well as a second switching element and a second flyback element corresponding to the second switching element.

Finally, the invention relates to:

a method for controlling an electric motor having at least one phase, said electric motor having a control device according to the invention, comprising the steps: detecting a first current for each phase, said first current flowing through the second switching element or first switching element corresponding to the respective phase, detecting a second current for each phase, said second current flowing through the flyback element corresponding to the respective second switching element or first switching element, and controlling the switching elements of the power unit of the control device, based on the detected currents.

The insight underlying the present invention is that the conventional manner of measuring current using external sensors in the individual phases is very complex and costly.

The concept underlying the present invention is to take the aforementioned insight into account and to provide an option in which the currents in the phases are directly detected at the switching elements or respectively the flyback elements.

As a result, provision is made in the present invention for the power unit to comprise switching elements and corresponding flyback elements, at which the control device can directly detect the currents flowing through the respective switching elements or flyback elements.

In so doing, the control device can detect the currents in the low-side switching elements, i.e. the second switching elements, or in the high-side switching elements, i.e. the first switching elements, and in the respective flyback elements.

Because the current flows in each case either through the switching element or the flyback element, but never simultaneously through both elements, the current in the respective phase can be detected in a control unit according to the present invention having only one evaluation unit for each phase without a costly or respectively complex sensor being necessary.

Advantageous embodiments of and modifications to the invention ensue from the dependent claims as well as from the description with reference to the figures in the drawings.

In one embodiment, the second switching elements and/or the first switching elements each have a first measuring tap which is coupled to the control device and which is designed to transmit information about the current flowing through the respective second switching element and/or first switching element to the control unit. If the measuring taps are directly integrated into the switching elements, the current flowing through the respective switching element can be very easily detected without further sensor technology.

In one embodiment, the second switching elements and/or first switching elements are designed as transistors. Furthermore, the first measuring taps are in each case formed in a substrate of one of the power connections of the transistors. The measuring taps can, for example, be designed as current mirrors. In this case, the substrate of one of the power connections is divided into two sub-regions that are electrically isolated from one another. The current flowing through the transistor divides itself up among the sub-regions in accordance with the area ratio of said sub-regions. If, for example, the ratio of the areas is 1/1000, i.e. the area which is assigned to the power connection is 1000 times greater than the area which is assigned to the measuring tap, a current is then emitted at the measuring tap which is smaller than the current which is emitted via the power connection by a factor of 1000. The current emitted via the measuring tap can then be detected by the control unit and the current flowing through the switching element can be calculated therefrom.

In one embodiment, the flyback elements associated in each case with the second switching elements or the first switching elements each have a first measuring tap, which is coupled to the control unit and which is designed to transmit information about the current flowing through respective flyback element to the control unit. If the measuring taps are directly integrated into the flyback elements, the current flowing through the respective flyback element can be very easily detected without further sensor technology.

In one embodiment, the flyback elements are designed as diodes and the second measuring taps are in each case formed in the substrate of an anode or a cathode of the diodes. For example, the measuring taps can also be designed as current mirrors in this case. In so doing, the substrate of the anode or the cathode is divided into two sub-regions that are electrically isolated from one another. The current flowing through the diode is divided up among the sub-regions in accordance with the area ratio of said sub-regions. If, e.g., the ratio of the areas is 1/1000, i.e. the area, which is assigned to the anode or the cathode is 1000 times greater than the area that is assigned to the measuring tap, a current is then emitted at the measuring tap which is smaller than the current that is emitted via the diode by a factor of 1000. The current emitted via the measuring tap can then be detected by the control unit and the current flowing through the flyback element can be calculated therefrom.

In one embodiment, the control device has a measuring input for each phase, in particular an analog-digital converter, wherein the corresponding first measuring tap and the corresponding second measuring tap are in each case coupled in a parallel circuit to the corresponding measuring input. Because the current either flows through the respective switching element or the respective flyback element, the first measuring taps and the second measuring taps can be connected in parallel to respectively one measuring input of the control device. As a result, the configuration of the measuring input is simplified.

In one embodiment, the electric motor has three phases. Furthermore, the power unit has three first switching elements and respectively one first flyback element corresponding to the first switching element and three second switching elements and respectively one flyback element corresponding to the second switching element. This makes it possible to use the present invention with electric motors that are common and are frequently used in the automotive field.

The embodiments mentioned above and modifications to the invention can, if useful, be arbitrarily combined with one another. Further possible embodiments, modifications and implementations of the invention also do not comprise explicitly specified combinations of features of the invention previously described or described below with regard to the exemplary embodiments. In the process, the person skilled in the art will also be able to add individual aspects as improvements or additions to the respective base form of the present invention.

BRIEF DESCRIPTION OF THE DRAWINGS

The present invention is explained below in detail using the exemplary embodiments depicted in the schematic figures of the drawings. In the drawings.

In all of the figures, identical or respectively functionally identical elements and devices—unless otherwise indicated—are provided with the same reference signs.

DETAILED DESCRIPTION

Figure 1:
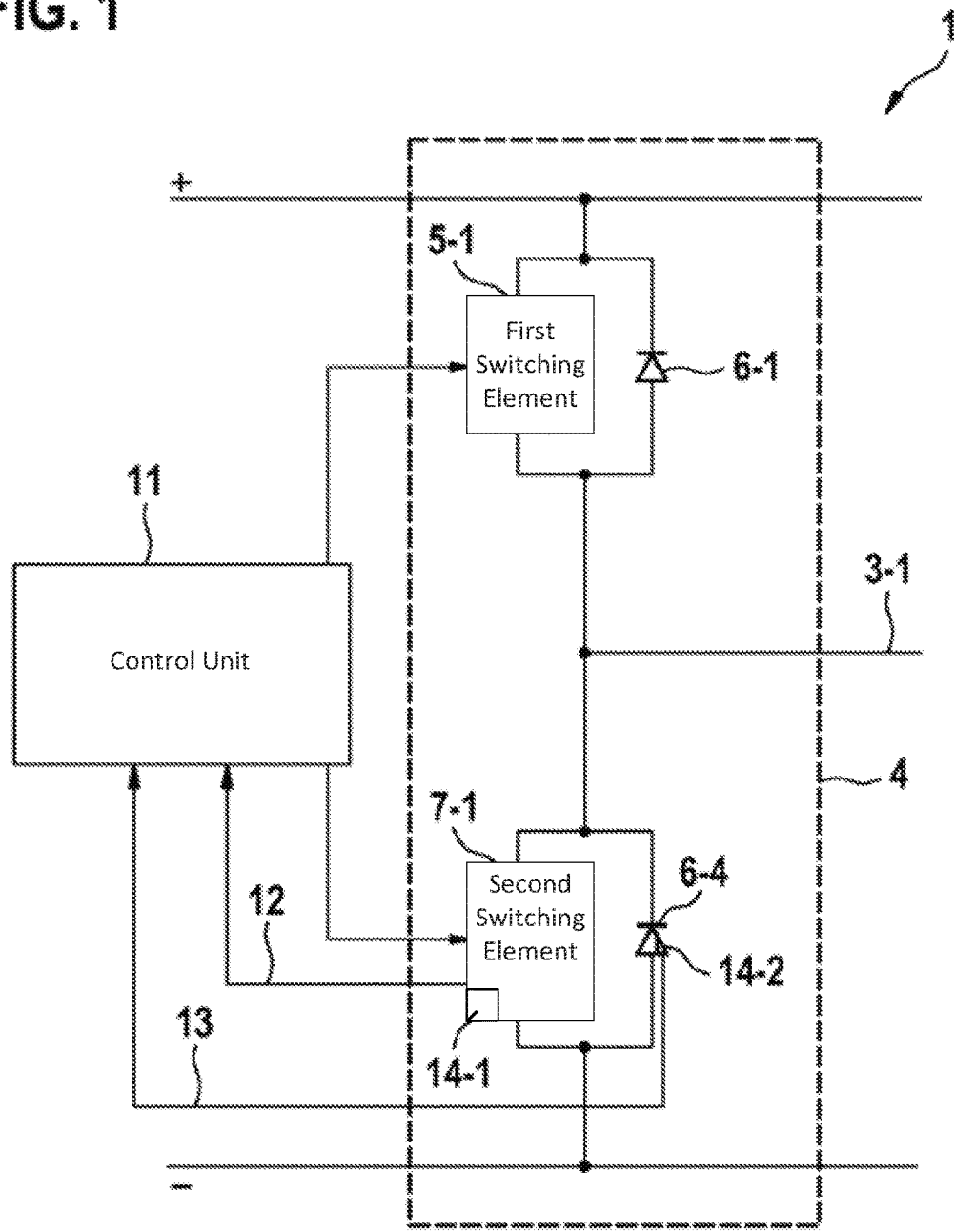
FIG. 1 shows a block wiring diagram of a control device according to the present invention.

FIG. 1 shows a block wiring diagram of an embodiment of the control device 1 according to the present invention.

The control device 1 comprises a control unit 11 and a power unit 4.

The power unit 4 has a first switching element 5-1, in relation to which a diode 6-1 is arranged as a first flyback element in an anti-parallel manner. The parallel circuit consisting of the first switching element 5-1 and the diode 6-1 is coupled on the cathode side of the diode to a positive supply line +. The power unit 4 comprises a further parallel circuit consisting of a second switching element 7-1 and flyback element 6-4, which is connected to the second switching element 7-1 in an anti-parallel manner and is designed as a diode 6-4. This second parallel circuit is coupled with the cathode side of the diode 6-4 to the anode side of the diode 6-1 of the first parallel circuit. Between the two parallel circuits, a phase 3-1 of an (not depicted) electric motor 2 is coupled to the power unit 4. The anode side of the diode 6-4 of the second parallel circuit is coupled to a negative supply line −, which conducts a negative supply voltage.

The control unit 11 is coupled to the switching elements 5-1 and 7-1 in order to control the same. Furthermore, the control unit 11 is coupled to the measuring taps 14-1 and 14-2. The first measuring tap 14-1 is disposed at the second switching element 7-1, and the second measuring tap 14-2 is disposed on the anode of the diode 6-4.

Currents in the phases of an electric motor 2 can be very easily detected with the control device 1 depicted in FIG. 1. In particular, no elaborate sensors are required in the individual phases 3-1-3-3.

Figure 2:
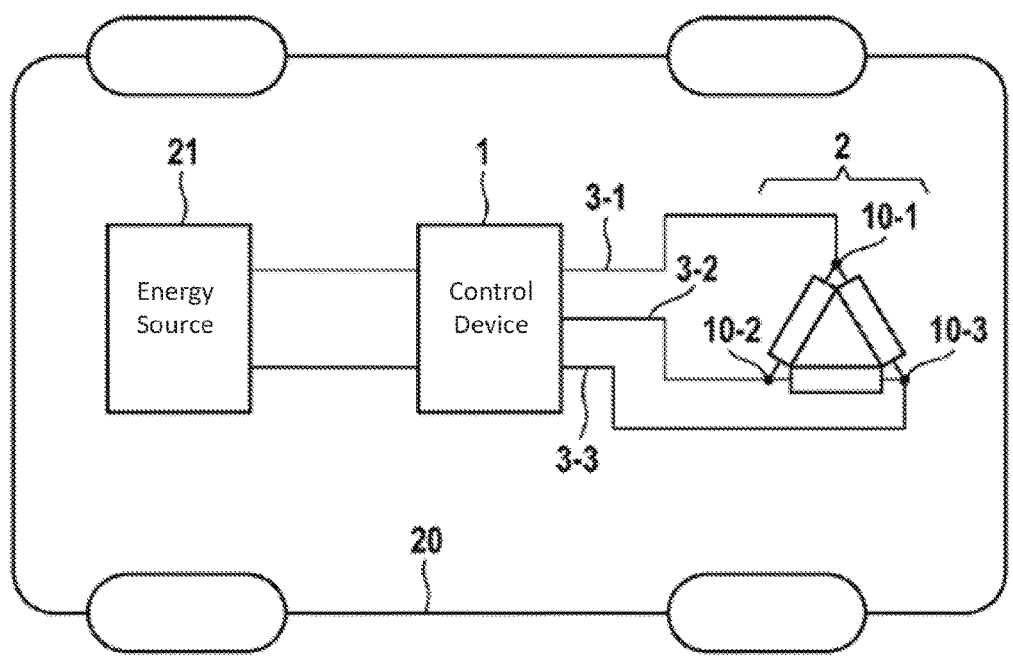
FIG. 2 shows a block wiring diagram of an embodiment of a vehicle according to the present invention.

FIG. 2 shows a block wiring diagram of an embodiment of a vehicle 20 according to the present invention.

The vehicle 20 of FIG. 2 is designed as an automobile 20. In further embodiments, the vehicle 20 can, however, also be any other type of vehicle, e.g. an electric bicycle, a pedelec, a truck, a rail vehicle, a water craft or an aircraft.

The vehicle 20 has an energy source 21, which, e.g., can be configured as a high-voltage battery 21 having a nominal voltage of 400 volts. The high-voltage battery 21 is coupled to the control device 1, which is coupled to the three phases 3-1-3-3 of the electric motor via the power connections 10-1-10-3 thereof.

Figure 3:
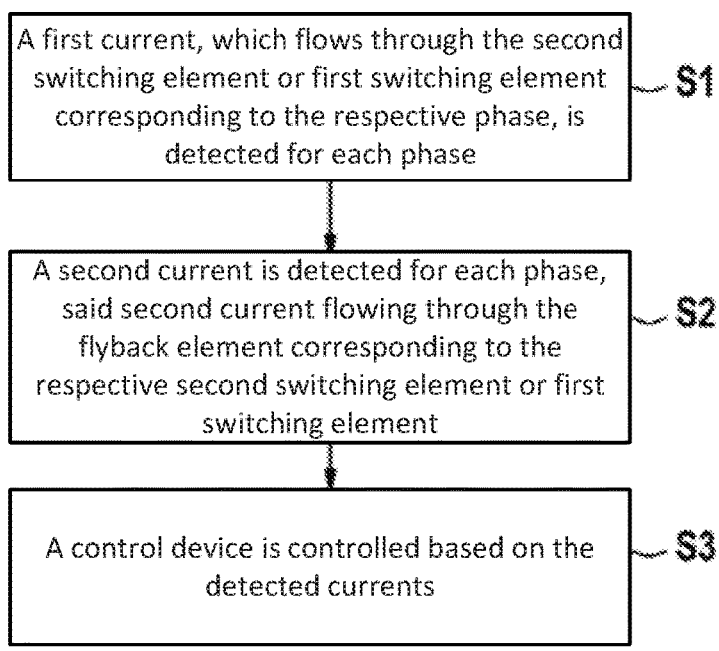
FIG. 3 shows a flow diagram of an embodiment of a method according to the present invention.

FIG. 3 shows a flow diagram of an embodiment of a method for controlling an electric motor 2 having at least one phase 3-1-3-3, said electric motor comprising a control device 1 according to the invention.

In a first step S1, a first current 12, which flows through the second switching element 7-1-7-3 or first switching element 5-1-5-3 corresponding to the respective phase 3-1-3-3, is detected for each phase 3-1-3-3.

Provision is made in a second step S2 for a second current 13 to be detected for each phase 3-1-3-3, said second current flowing through the flyback element 6-1-6-6 corresponding to the respective second switching element 7-1-7-3 or first switching element 5-1-5-3. The steps S1 and S2 can occur alternately or in parallel.

Finally, provision is made in a third step S3 of the method for the switching elements 5-1-5-3, 7-1-7-3 of the power unit 4 of the control device 1 to be controlled based on the detected currents.

Figure 4:
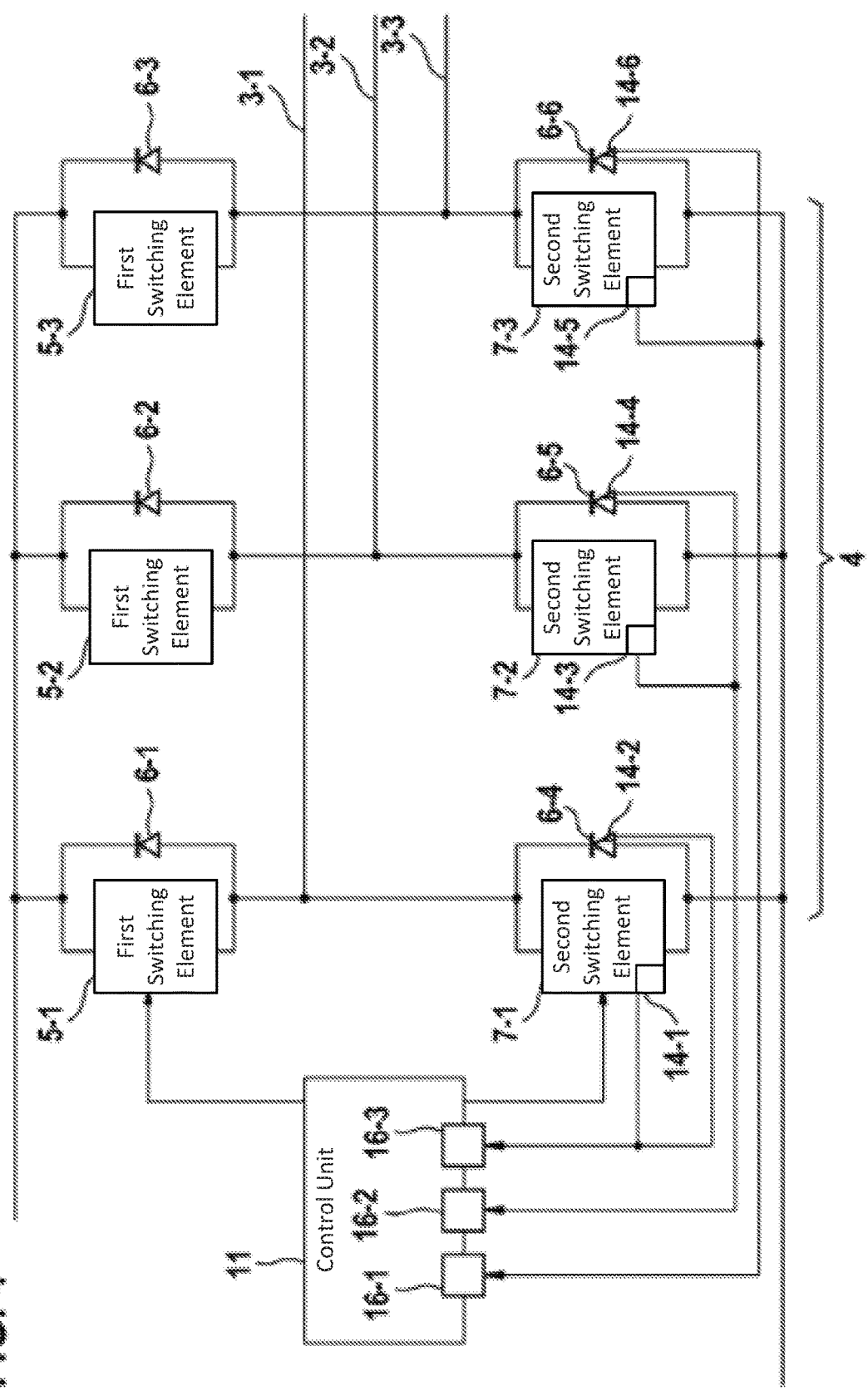
FIG. 4 shows a block wiring diagram of an embodiment of a control device according to the present invention.

FIG. 4 shows a block wiring diagram of an embodiment of a control device 1 according to the present invention.

The control device 1 of FIG. 4 is based on the control device 1 of FIG. 1. The control device 1 of FIG. 4 furthermore comprises first switching elements 5-2, 5-3 and second switching elements 7-2, 7-3 having the respective flyback elements 6-2, 6-3, 6-5, 6-6 for two further phases 3-2, 3-3. The additional elements for the further two phases 3-2, 3-3 are disposed analogously to the elements described with regard to FIG. 1.

In contrast to FIG. 1, the lines of respectively one second switching element 7-1-7-3 and the respective flyback elements 6-4-6-6 are routed in parallel to a single measuring connection 16-1-16-3 of the control device 11. This is possible because a current can flow either through the respective switching element 7-1-7-3 or through the respective flyback element 6-4-4-6 but not through both at the same time.

It can be seen in FIG. 4 how the control device 11 having only 3 measuring inputs 16-1-16-3 can detect the currents in the individual phases 3-1-3-3 of the electric motor.

Depending on the embodiment of the switching elements 7-1-7-3 and the flyback elements 6-4-6-6, the control device 11 can calculate the current from the current detected via the respective measuring tap 14-1-14-6. For example, the control device 11 can multiply the detected current by the area ratio explained in regard to FIG. 5.

In a further embodiment, the first switching elements 5-1-5-3 and the corresponding flyback elements 6-1-6-3 thereof can also comprise the measuring taps 14-1-14-6.

The control device 11 can use a known method to control the switching elements 5-1-5-3 and 7-1-7-3.

Figure 5:
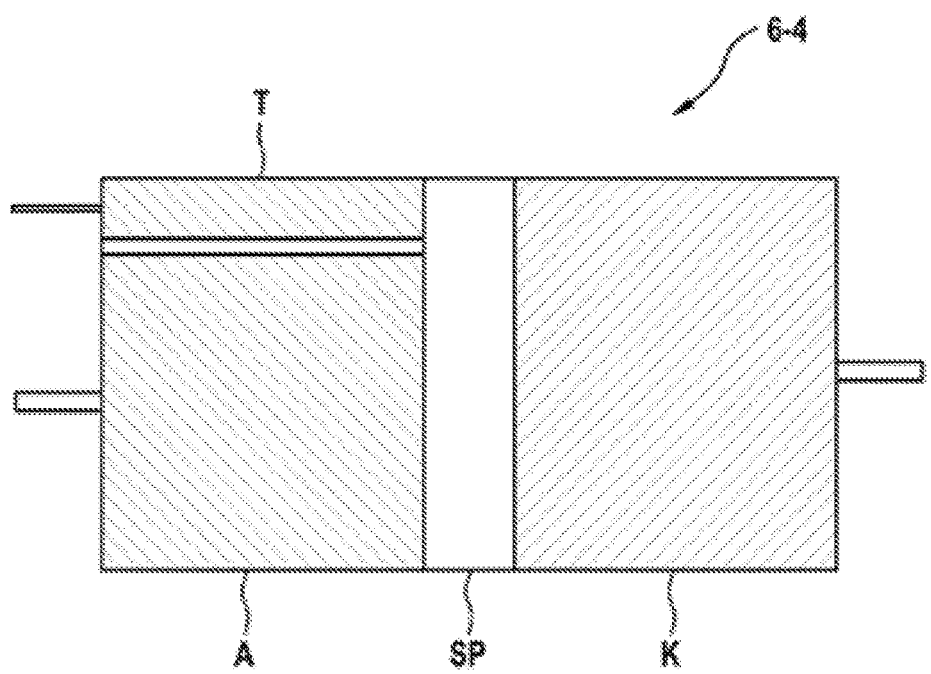
FIG. 5 shows a depiction of an embodiment of a diode according to the present invention.
Figure 6:
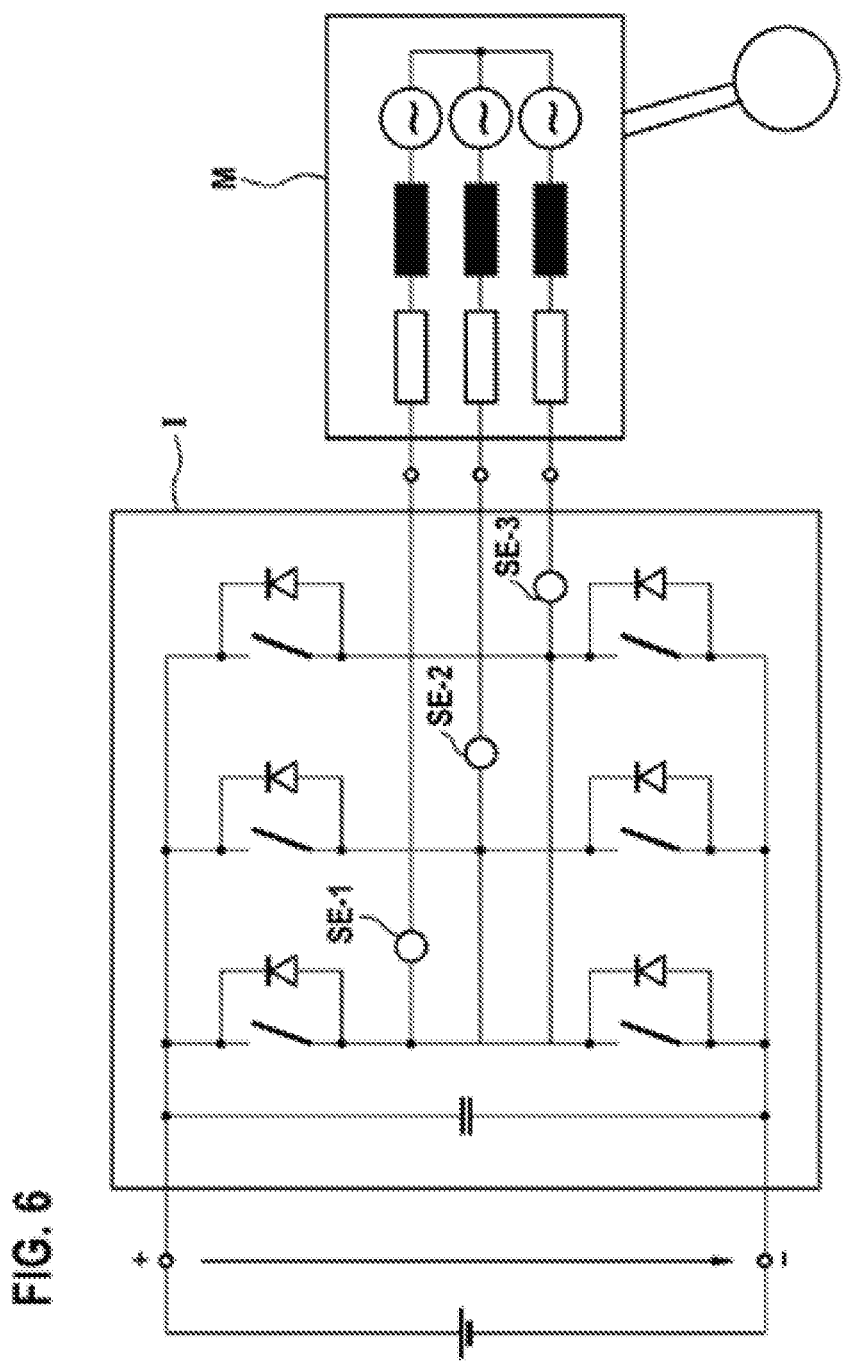
FIG. 6 shows a block wiring diagram of a conventional motor control system.

FIG. 5 shows a depiction of an embodiment of a diode 6-4 according to the present invention.

The diode 6-4 in FIG. 5 has an anode region A and a cathode region K, which are separated by the barrier layer SP of the diode D.

In the case of the diode 6-4, the anode region furthermore comprises a sub-region T, which is arranged so as to be electrically isolated from the remainder of the anode region. In this case, the remainder of the anode region A is significantly larger than the sub-region T.

If current flows through the diode 6-4, the diode current splits up between the anode region A and the sub-region T in accordance with the area ratio thereof, as previously explained above.

If, e.g., the anode region A is greater than the sub-region T by a factor of 1000, a current then flows through the anode region A which is greater than the current which flows through sub-region T by a factor of 1000.

If the current through the anode region A is, e.g., 800 A, the current through the sub-region T is then 0.8 A.

The area ratio of the anode region A to the sub-region T can, if required, be adapted to different applications.

The switching elements 5-1-5-3, 7-1-7-3 which comprise the measuring taps 14-1, 14-3 and 14-5 can be designed as transistors in the same way as the diode described here. In the case of transistors, the substrate of one of the power connections has however an electrically insulating sub-region.

Although the present invention was described above using preferred exemplary embodiments, it is not limited thereto but can be modified in a variety of ways. The invention can particularly be changed or modified in a variety of ways without deviating from the essence of the invention.

The invention claimed is:

1. A control device for an electric motor having at least one phase, said control device comprising:
   a power unit which, for each phase of the electric motor, has a first switching element and a first flyback element corresponding to the first switching element as well as a second switching element and a second flyback element corresponding to the second switching element, wherein the respective first switching element is designed to couple a corresponding power connection of the electric motor with a positive supply voltage, and the respective second switching element is designed to couple the corresponding power connection of the electric motor with a negative supply voltage, and
   a control unit which is designed to separately detect, in each of the phases, a first current flowing through the second switching element or first switching element corresponding to the phase and which is designed to detect a second current flowing through the flyback element corresponding to the respective second switching element or first switching element,
   wherein the control unit is furthermore designed to control the switching elements of the power unit based on the detected currents,
   wherein the second switching element, the first switching element, or both each have a first measuring tap coupled to the control unit and which is designed to transmit information about the current flowing through the second switching element, the first switching element, or both the first switching element and second switching element to the control unit, wherein the first measuring tap is directly integrated into the second switching element, the first switching element, or both the second switching element and the first switching element, and
   wherein the flyback elements associated in each case with the second switching elements or first switching elements have in each case a second measuring tap coupled to the control unit and which is designed to transmit information about the current flowing through the respective flyback element to the control unit, wherein the second measuring tap is directly integrated into the flyback elements associated in each case with the second switching elements or first switching elements.

2. The control device according to claim 1, wherein the second switching elements, the first switching elements, or both are designed as transistors and the first measuring taps are in each case formed in a substrate of one of the power connections of the transistors.

3. The control device according to claim 1, wherein the flyback elements are designed as diodes and the second measuring taps are each formed in a substrate of an anode or a cathode of the diodes.

4. The control device according to claim 1, wherein the control unit has a measuring input for each phase, wherein the corresponding first measuring tap and the corresponding second measuring tap are each coupled in a parallel circuit to the corresponding measuring input.

5. The control device according to claim 1, wherein the electric motor has three phases and the power unit has three first switching elements and in each case a first flyback element corresponding to the first switching elements and three second switching elements and in each case a second flyback element corresponding to the second switching elements.

6. A vehicle comprising
an electric motor having at least one phase;
comprising an energy source; and
a control device including
a power unit which, for each phase of the electric motor, has a first switching element and a first flyback element corresponding to the first switching element as well as a second switching element and a second flyback element corresponding to the second switching element (7-1-7-3), wherein the respective first switching element is designed to couple a corresponding power connection of the electric motor with a positive supply voltage, and the respective second switching element is designed to couple the corresponding power connection of the electric motor with a negative supply voltage, and
a control unit which is designed to separately detect, in each of the phases, a first current flowing through the second switching element or first switching element corresponding to the phase and which is designed to detect a second current flowing through the flyback element corresponding to the respective second switching element or first switching element,
wherein the control unit is furthermore designed to control the switching elements of the power unit based on the detected currents,
wherein the second switching element, the first switching element, or both each have a first measuring tap coupled to the control unit and which is designed to transmit information about the current flowing through the second switching element, the first switching element, or both the first switching element and second switching element to the control unit, wherein the first measuring tap is directly integrated into the second switching element, the first switching element, or both the second switching element and the first switching element, and wherein the flyback elements associated in each case with the second switching elements or first switching elements have in each case a second measuring tap coupled to the control unit and which is designed to transmit information about the current flowing through the respective flyback element to the control unit, wherein the second measuring tap is directly integrated into the flyback elements associated in each case with the second switching elements or first switching elements.

7. A method for controlling an electric motor having at least one phase, said electric motor comprising a control device a power unit which, for each phase of the electric motor, has a first switching element and a first flyback element corresponding to the first switching element as well as a second switching element and a second flyback element corresponding to the second switching element, wherein the respective first switching element is designed to couple a corresponding power connection of the electric motor with a positive supply voltage, and the respective second switching element is designed to couple the corresponding power connection of the electric motor with a negative supply voltage, the method comprising:
detecting for each phase a first current which flows through the second switching element or first switching element corresponding to the respective phase;
detecting for each phase a second current which flows through the flyback element corresponding to the respective second switching element or first switching element; and
controlling the switching elements of the power unit of the control device based on the detected currents,
wherein detecting the first current includes detecting the first current at the second switching element or the first switching element with a first measuring tap directly integrated into the second switching element, the first switching element, or both the second switching element and the first switching element, the first measuring tap coupled to the control unit, and
wherein detecting the second current includes detecting the second current at the flyback element corresponding to the respective second switching element or first switching element with a second measuring tap directly integrated into the flyback element corresponding to the respective second switching element, first switching element, or both the second switching element and the first switching element, the second measuring tap coupled to the control unit.

8. The method according to claim 7, wherein the first currents and the second currents for each phase are in each case alternately measured via an individual measuring input for each phase.

9. The control device according to claim 1, wherein the control unit is configured to detect the first current at the second switching element or the first switching element and to detect the second current at the flyback element corresponding to the respective second switching element or first switching element.

10. The control device according to claim 1, wherein the first measuring tap and the second measuring tap are coupled in a parallel circuit to one measuring input of the control device, and wherein the control unit alternately detects the first current and the second current via the one measuring input.

* * * * *